United States Patent
Liu et al.

(10) Patent No.: US 7,265,620 B2
(45) Date of Patent: Sep. 4, 2007

(54) WIDE-BAND HIGH-GAIN LIMITING AMPLIFIER WITH PARALLEL RESISTOR-TRANSISTOR SOURCE LOADS

(75) Inventors: Wing Faat Liu, San Jose, CA (US); Michael Y. Zhang, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 187 days.

(21) Appl. No.: 11/160,730

(22) Filed: Jul. 6, 2005

(65) Prior Publication Data

US 2007/0008035 A1   Jan. 11, 2007

(51) Int. Cl.
H03F 3/45        (2006.01)
(52) U.S. Cl. ....................................... 330/253
(58) Field of Classification Search ................ 330/253, 330/260
See application file for complete search history.

(56) References Cited

U.S. PATENT DOCUMENTS

| | | | |
|---|---|---|---|
| 3,832,489 A | 8/1974 | Rallapalli | 178/71.1 |
| 4,061,970 A | 12/1977 | Magneron | 455/14 |
| 4,123,625 A | 10/1978 | Chow | 375/214 |
| 4,710,724 A | 12/1987 | Connell et al. | 330/9 |
| 4,956,613 A | 9/1990 | Hosticka et al. | 330/253 |
| 5,046,185 A | 9/1991 | Hirai et al. | 375/214 |
| 5,391,981 A | 2/1995 | Masson | 323/316 |
| 5,596,299 A * | 1/1997 | Persico et al. | 330/260 |
| 5,973,558 A | 10/1999 | Date et al. | 330/51 |
| 6,345,390 B1 | 2/2002 | Eto et al. | 725/127 |
| 6,369,652 B1 * | 4/2002 | Nguyen et al. | 330/253 |
| 6,680,681 B1 | 1/2004 | Hsu et al. | 341/144 |
| 6,816,002 B2 | 11/2004 | Bruck | 327/538 |
| 6,870,425 B2 * | 3/2005 | Leifso et al. | 330/254 |
| 6,882,295 B2 | 4/2005 | Leung | 341/155 |
| 6,906,589 B2 * | 6/2005 | Ikeda et al. | 330/261 |
| 6,992,526 B2 * | 1/2006 | Cheng | 330/9 |
| 2004/0013182 A1 | 1/2004 | Tonietto et al. | 375/220 |
| 2004/0091028 A1 | 5/2004 | Aronson et al. | 375/219 |

FOREIGN PATENT DOCUMENTS

JP        05075359 A  *  3/1993

* cited by examiner

*Primary Examiner*—Robert Pascal
*Assistant Examiner*—Alan Wong
(74) *Attorney, Agent, or Firm*—g Patent LLC; Stuart T. Auvinen

(57) ABSTRACT

An amplifier has a wide bandwidth and a high gain by using parallel loads. Each load has a load resistor and a load p-channel transistor in parallel. The drain voltages of differential n-channel transistors can be set by the load resistors, while switching current is provided by the load p-channel transistors. The parallel load provides a high impedance to the drain nodes yet still provides driving current. A transconductance stage with a pair of differential transistors and two parallel loads drives a shunt-shunt-feedback stage that has another pair of differential transistors and two more parallel loads. Shunt resistors between the gate and drain of the differential transistors in the shunt-shunt-feedback stage provide shunt feedback and low impedance. Several pairs of transconductance and shunt-shunt-feedback stages can be cascaded together. The cascaded amplifier may be used as a signal repeater.

19 Claims, 6 Drawing Sheets

WIDE-BAND HIGH-GAIN LIMITING AMPLIFIER WITH PARALLEL RESISTOR-TRANSISTOR SOURCE LOADS

FIELD OF THE INVENTION

This invention relates to amplifier circuits, and more particularly to complementary metal-oxide-semiconductor (CMOS) amplifier circuits with parallel loads.

BACKGROUND OF THE INVENTION

High-speed signals that are transmitted through a medium such as a cable or line on a printed-circuit board (PCB) are attenuated and distorted by the medium. Variable delay and high-frequency components add to the distortion. Signal pulses may be spread out and interfere with other pulses. The length of the medium is limited by such attenuation and distortion.

Signal repeaters can be added in the middle of the medium to increase the distance that signals can be transmitted. FIG. 1 shows a signal repeater that can be inserted into a medium. Equalizer 10 receives inputs from one segment of the medium. Equalizer 10 recovers the signal from the input medium, and drives a recovered signal to limiting amplifier 12. The signal is amplified and limited in voltage or signal swings by limiting amplifier 12. Transmitter 14 receives the amplified signal and drives another segment of the medium. Transmitter 14 may use de-emphasis to better drive the signal. For one-tap de-emphasis, the first bit after a transaction may have an increased signal amplitude compared to other bits. The distorted and attenuated signal received by equalizer 10 is recovered, amplified, and driven onto the next segment of the medium by this repeater.

What is desired is a limiting amplifier that has a high gain and a wide band is desirable. A limiting amplifier that can be used in a signal repeater is desirable.

DETAILED DESCRIPTION

The present invention relates to an improvement in amplifier circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
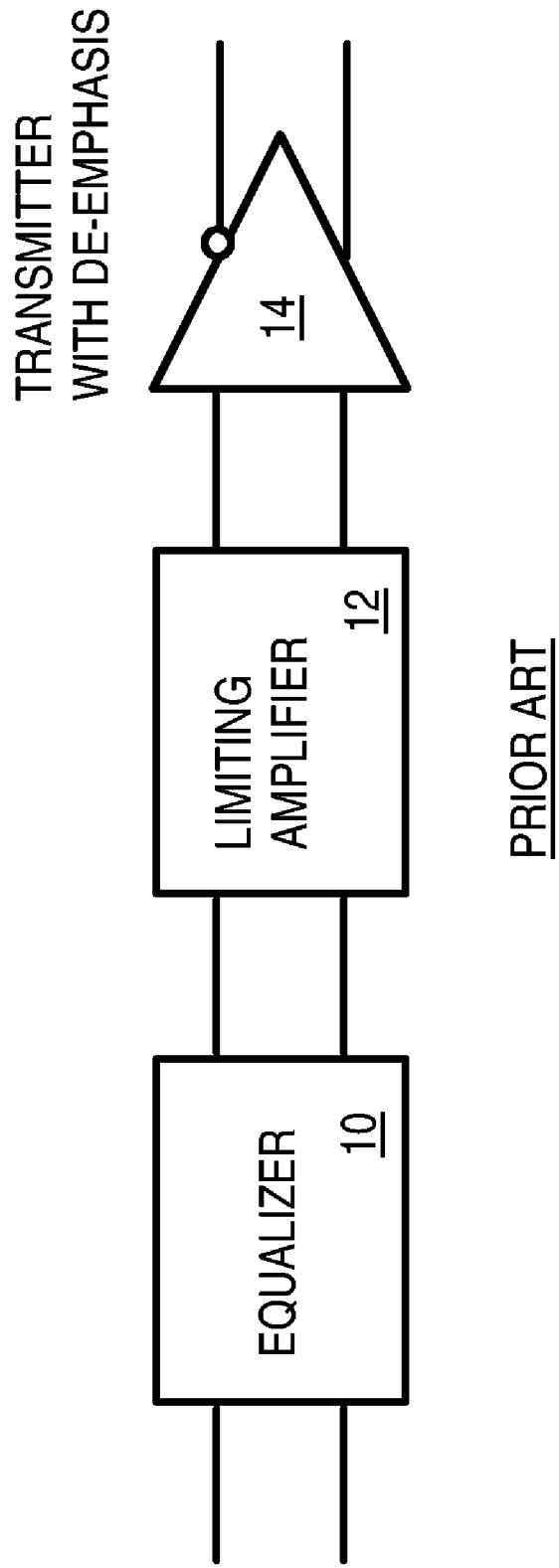
FIG. 1 shows a signal repeater that can be inserted into a medium.
Figure 2:
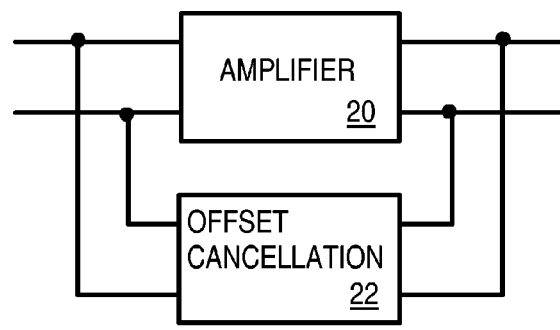
FIG. 2 shows a block diagram of an amplifier with offset cancellation.

FIG. 2 shows a block diagram of an amplifier with offset cancellation. Amplifier 20 and offset cancellation 22 may be used as limiting amplifier 12 (FIG. 1) of a signal repeater, or in other applications such as data communication receivers. Offset cancellation 22 prevents the D.C. offset or bias from saturating amplifier 20. Offset cancellation 22 senses the amplifier output DC offset and produces a differential DC current. This current is negative feedback to the input of amplifier 22 to cancel its DC offset.

Figure 3:
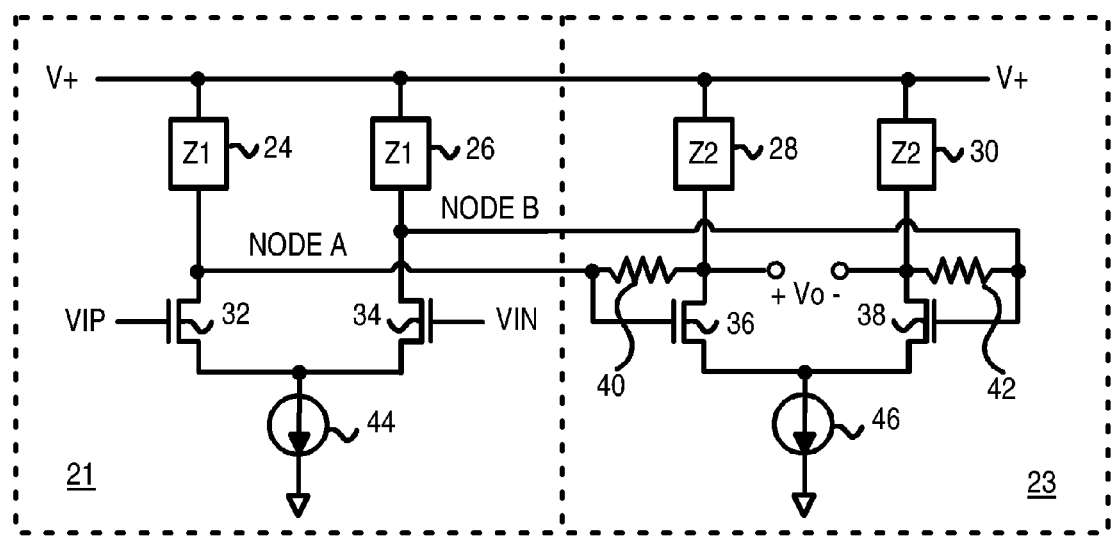
FIG. 3 shows a 2-stage amplifier.

FIG. 3 shows a 2-stage amplifier. The first amplifier stage is transconductance stage 21, which drives the NODE_A, NODE_B inputs to the second stage, shunt-shunt-feedback stage 23. A differential input VIP, VIN is applied to the gates of differential transistors 32, 34, which have sources connected together and to current sink 44. The drains of differential transistors 32, 34 are NODE_A and NODE_B, respectively, which are inter-stage signals that drive the gates of differential transistors 36, 38, respectively, in shunt-shunt-feedback stage 23. The sources of differential transistors 36, 38 are connected together and to current sink 46.

The drains of differential transistors 36, 38 are the amplifier outputs Vo+, Vo−. Feedback from the amplifier outputs to the inputs of shunt-shunt-feedback stage 23, inter-stage signals NODE_A, NODE_B, is provided by shunt feedback resistors 40, 42. Shunt feedback resistors 40, 42 provide low input and output impedance for shunt-shunt-feedback stage 23.

Transconductance stage 21 has a gain of gm1. Loads 24, 26, 28, 30 should have large impedance values so as not to degrade the gain. For large values of loads 24, 26, 28, 30, the total voltage gain of the two stages is about −gm1*Rx, where Rx is the value of shunt feedback resistors 40, 42. The input and output impedance of shunt-shunt-feedback stage 23 is about 1/gm2.

Loads 24, 26, 28, 30 may be implemented as current sources or high-value resistors. However, using ideal current sources for loads 24, 26, 28, 30 continuously drives current to NODE_A, NODE_B and Vo+, Vo− so that the D.C. voltages of these nodes are undefined. A common-mode feedback or a D.C. bias circuit may be added to define these node voltages. However, adding feedback or bias circuits for these nodes can degrade amplifier bandwidth and complicate the circuitry.

When high-value resistors are used for loads 24, 26, 28, 30, the voltages of NODE_A, NODE_B and Vo+, Vo− can fall to low levels. Low voltages on NODE_A, NODE_B and Vo+, Vo− can cause differential transistors 32, 34, 36, 38 to operate in the linear region rather than in the saturated region. Differential transistors 32, 34, 36, 38 could even turn off at input-voltage extremes during A.C. switching. Amplifier performance is improved when differential transistors 32, 34, 36, 38 operate in the saturated region.

Figure 4:
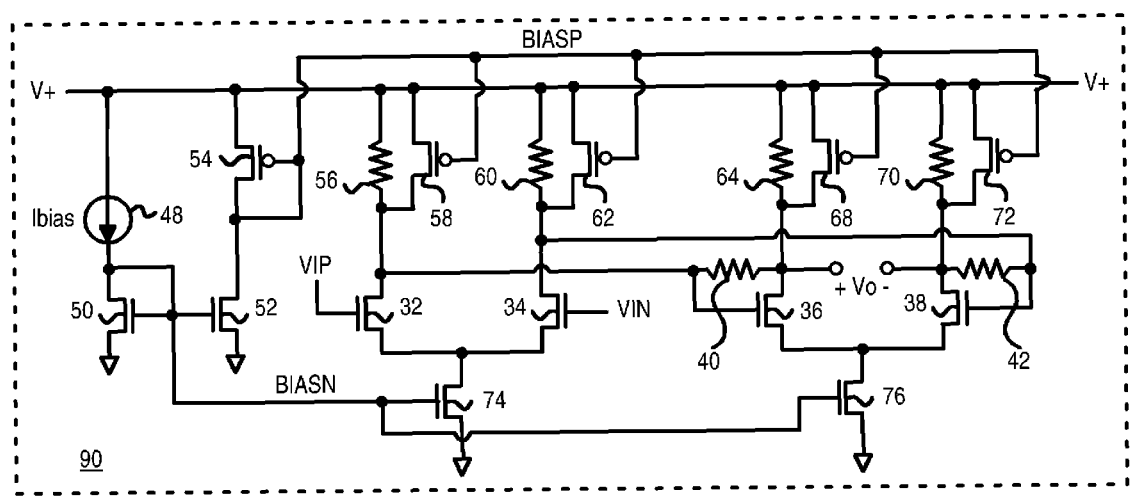
FIG. 4 is a schematic of an amplifier with parallel transistor-resistor loads.

FIG. 4 is a schematic of an amplifier with parallel transistor-resistor loads. The inventor has realized that a current source and a resistor may be used in parallel for each of loads 24, 26, 28, 30. The current source is implemented as a p-channel transistor.

For example, load 24 (FIG. 3) is implemented as load resistor 56 in parallel with p-channel load transistor 58. Load 26 (FIG. 3) on the drain of differential transistor 34 is implemented as load resistor 60 in parallel with p-channel load transistor 62.

A small amount of current passes through load resistors 56, 60 to define the voltages on NODE_A, NODE_B, respectively. P-channel load transistors 58, 62 act as current sources that drive current to defined voltages on NODE_A, NODE_B that are voltages set by load resistors 56, 60. Load resistors can have a high resistance value, such as 20 K-Ohm.

For shunt-shunt-feedback stage 23, load 28 (FIG. 3) is implemented as load resistor 64 in parallel with p-channel load transistor 68. Load 30 (FIG. 3) on the drain of differential transistor 34 is implemented as load resistor 70 in parallel with p-channel load transistor 72.

A small amount of current passes through load resistors 64, 70 to help define the voltages on Vo+, Vo−, respectively. P-channel load transistors 68, 72 act as current sources that drive current to defined voltages on Vo+, Vo− that are voltages set by load resistors 64, 70. Differential transistors 36, 38 in shunt-shunt-feedback stage 23 are kept operating in the saturated region by keeping the drain and output voltages Vo+, Vo− near the stage input voltages NODE_A, NODE_B applied to the gates of differential transistors 36, 38.

Differential transistors 32, 34 in transconductance stage 21 are kept operating in the saturated region. A DC current is provided by p-channel load transistors 58, 62, 68, 72. When transistors 32, 34, 36, 38 are switching, p-channel load transistors 58, 62, 68, 72 source the load currents.

The size of each of p-channel load transistors 58, 62 can be slightly less than half of the size of n-channel tail transistor 74. For example, when n-channel tail transistor 74 has a width of M, p-channel load transistor 58 can have a width of M/2−X, where X approximately accounts for the current delivered by load resistor 56. The size of p-channel load transistor 62 can match the size of p-channel load transistor 58.

Likewise, the sizes of p-channel load transistors 68, 72 can be K/2−Y, where K is the size of n-channel tail transistor 76. Y can be a small value that approximates the current delivered by load resistor 64. For example, when load resistor 64 delivers 10% of the current that p-channel load transistor 68 does, Y can be K/20. This approximation does not have to be exact as long as the transistors operate in the saturation region. For example, transistors are often physically laid out as having multiple legs or fingers. K can be the number of fingers. Y can be approximated as 1 finger. Then p-channel load transistors 68, 72 can be one finger less than K/2. When K/2 is not an integer (4.5, etc.), then Y could be 0.5 finger or could be rounded to an integer number of fingers.

The gates of tail transistors 74, 76 are driven by another bias voltage, BIASN. Bias current source 48 generates a current IBAS from the power supply V+(or Vcc or Vdd) that is driven through n-channel bias transistor 50. The gate and drain of n-channel bias transistor 50 are connected together as bias voltage BIASN. The gate voltage of n-channel bias transistor 50 is adjusted until the current passing through the channel of transistor 50 matches IBIAS.

BIASN is applied to the gate of n-channel transistor 52, causing a current to be pulled through p-channel transistor 54. The gate and drain of p-channel transistor 54 are connected together as BIASP. The gate voltage of p-channel transistor 54 is adjusted until the current sourced through p-channel transistor 54 matches the current sunk through n-channel transistor 52. The target values of BIASP and BIASN can be set by the circuit designer by the chosen ratios of transistor sizes for transistors 50, 52, 54.

BIASP can be 1.06 volts, while BIASN is 0.56 volts when V+ is 1.8 volts and ground is 0 volts. The inputs VIP, VIN, may swing from 0.9 to 1.5 volts. Many other values are possible.

Transconductance stage 21 and shunt-shunt-feedback stage 23 are two stages in amplifier 90. To increase the total gain, several stages of amplifier 90 may be cascaded together.

Figure 5A:
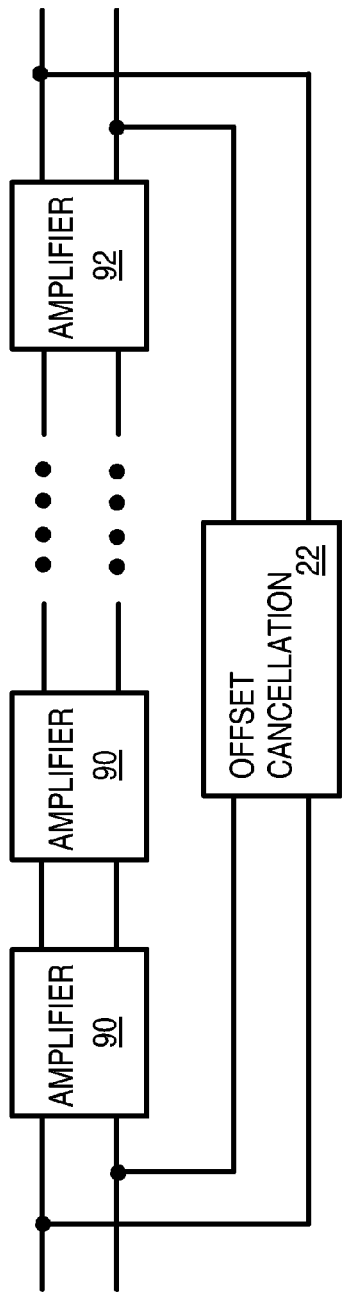
FIGS. 5A-B show several amplifier stages cascaded together.
Figure 5B:
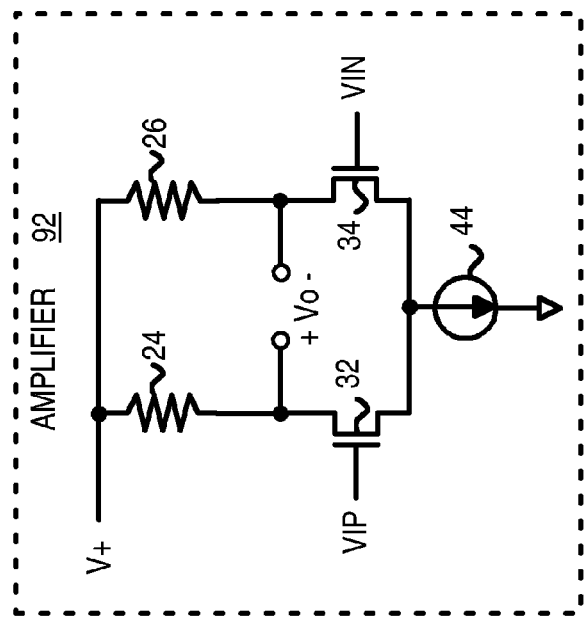

FIGS. 5A-B show several amplifier stages cascaded together. In FIG. 5A, several amplifiers 90 are cascaded together. The sizes of transistors in different copies of amplifier 90 can be different. For example, increasingly larger transistors sizes can be used for differential transistors farther along the cascade of amplifiers 90.

The final amplifier stage is final amplifier 92, which can have a different structure as shown in FIG. 5B. The input signals to the stage, VIP, VIN, are applied to the gates of differential transistors 32, 34. Current sink 44 is connected to the sources of differential transistors 32, 34. Loads 24, 26 are implemented as resistors between power V+ and outputs Vo+, Vo−, which are also the drains of differential transistors 32, 34. The amplitude of outputs Vo+, Vo− is limited to I*R by final amplifier 92. For a 1 mA current (I), R can be 1 k with a 1-volt output swing, but other values are possible.

Figure 6:
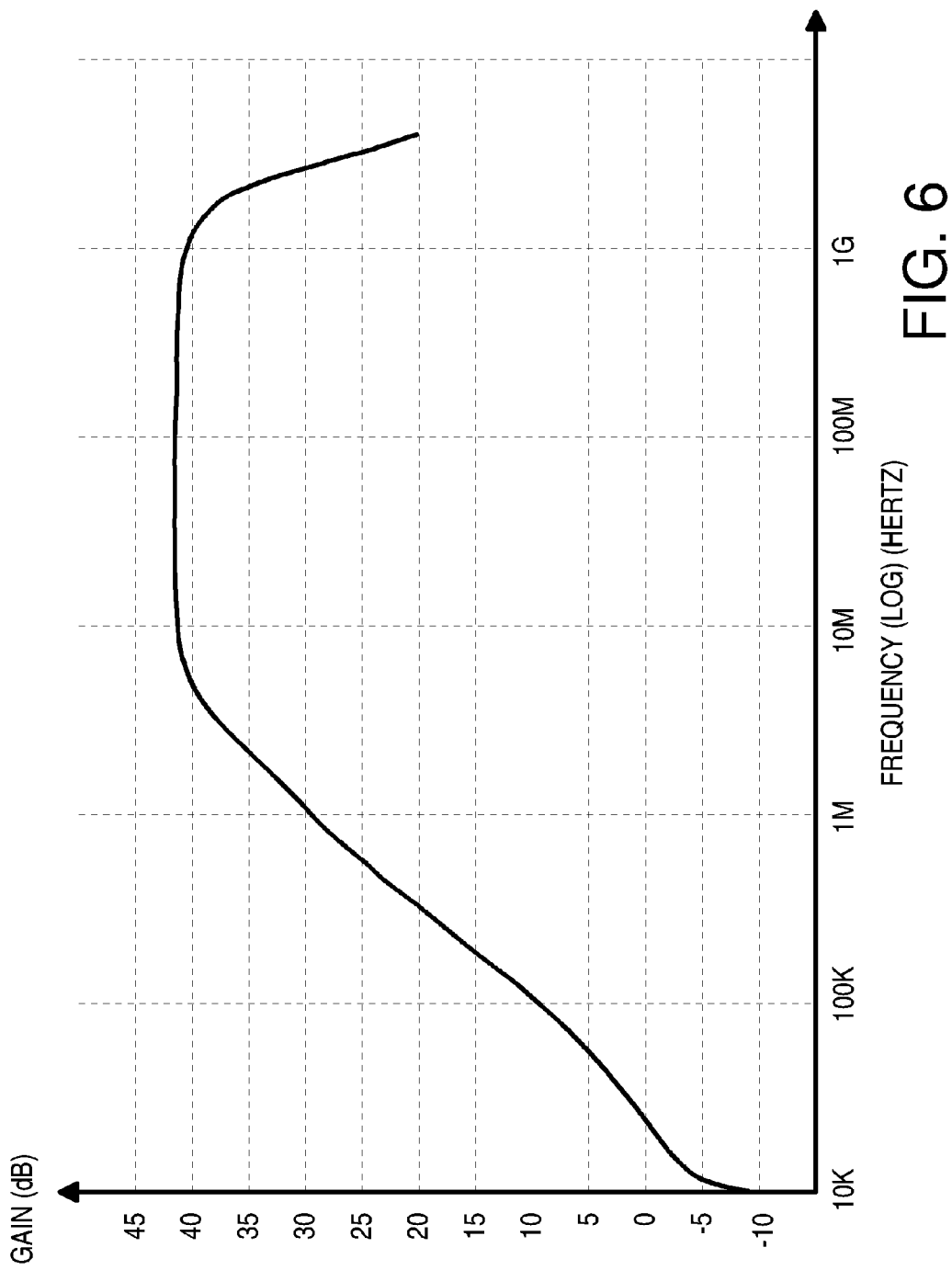
FIG. 6 is a plot of frequency response of the cascaded amplifier of FIG. 5A.

FIG. 6 is a plot of frequency response of the cascaded amplifier of FIG. 5A. The maximum gain is over 40 dB and the bandwidth is 2 GHz before the gain drops off. The roll-off at lower frequencies is due to offset cancellation 22.

Figure 7:
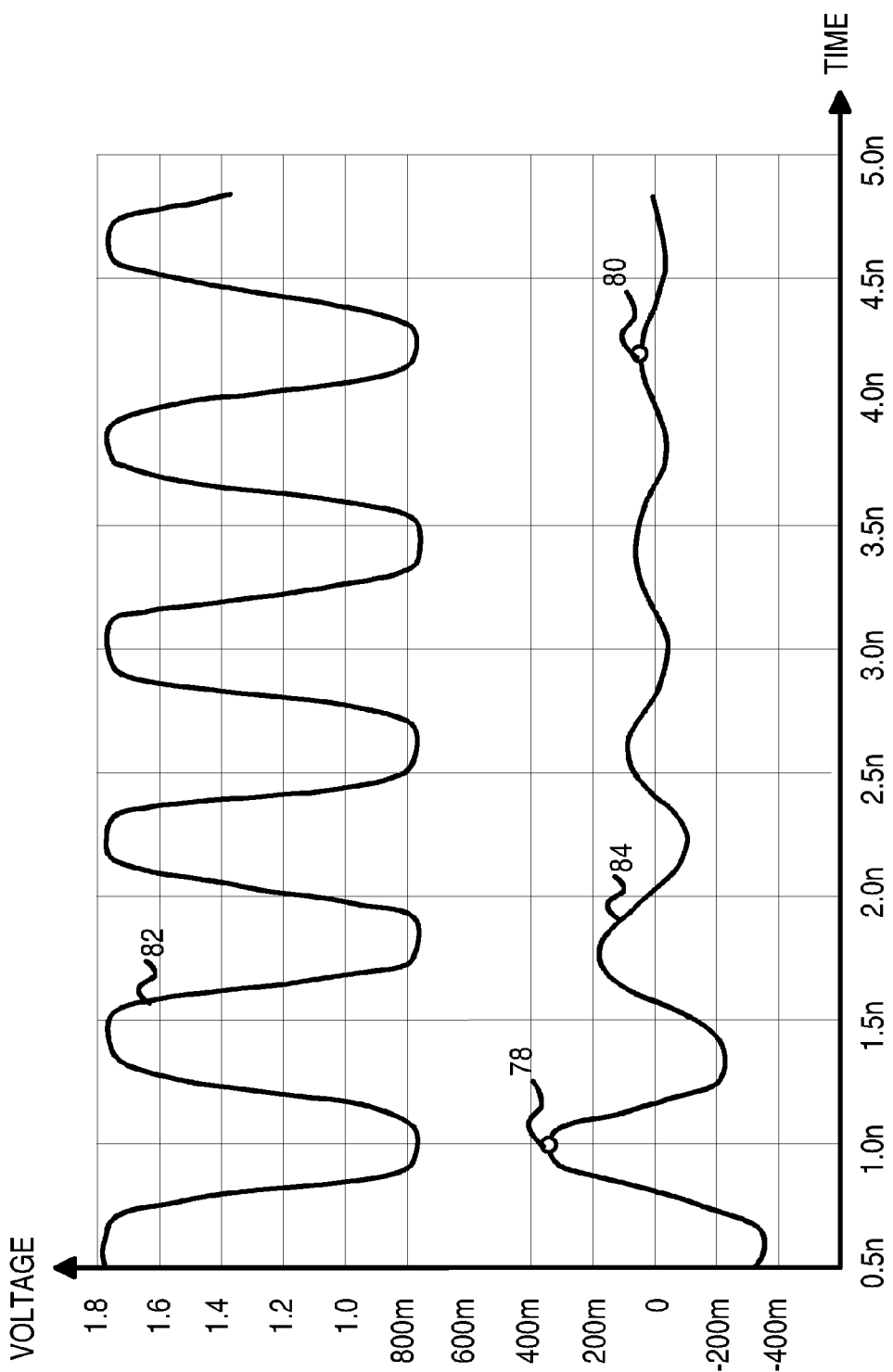
FIG. 7 is a graph of a simulation of the operation of the amplifier of FIG. 5A.

FIG. 7 is a graph of a simulation of the operation of the amplifier of FIG. 5A. Input curve 84 is the VIP input, offset from a 1-volt DC offset to a 0-volt DC offset on the plot to separate curves 82, 84. The VIN input (not shown) is opposite the VIP input. The amplitude of the sine-wave input is gradually reduced in the simulation as time elapses. Initially, at time 78, the input swings +/−0.32 volts. This is amplified by amplifier 90 and other stages to generate output curve 82. At time 78, the output swings fully from 0.8 to 1.8 volts. Full output swings continue on output curve 82 as the input swing is reduced on input curve 84. Eventually, at time 80, the input swing is very small, only +/−0.034 volts, yet the amplifier still is able to generate the full-swing output as shown by output curve 82.

Alternate Embodiments

Several other embodiments are contemplated by the inventors. For example the circuit can be flipped over and p-channel differential and tail transistors used with n-channel load transistors. Some stages could be flipped over while other stages are not. Different values of transistor sizes and resistances may be used. Different gains and other circuit responses may be obtained than those in the simulations described herein. Various ground and power-supply voltage values may be used, such as 0, 1.8 volts, or −0.9, +0.9, or 0, 3.3 volts, or others. Transistors may be implemented in a standard complementary metal-oxide-semiconductor (CMOS) process, or in more exotic device processes. Additional components may be added, and various parasitic components may also be present.

Current can be positive or negative and considered to flow in either direction.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A wideband amplifier comprising:
a first differential input and a second differential input that are driven in opposite directions to carry data;
a transconductance stage that comprises:
a first differential transistor having a gate that receives the first differential input, the gate controlling current in a channel between a first inter-stage node and a first tail node;
a first load between a first supply and the first inter-stage node, the first load having a first resistor in parallel with a channel of a first load transistor;
a second differential transistor having a gate that receives the second differential input, the gate controlling current in a channel between a second inter-stage node and the first tail node;
a second load between the first supply and the second inter-stage node, the second load having a second resistor in parallel with a channel of a second load transistor;
a second stage that comprises:
a third differential transistor having a gate that receives the first inter-stage node, the gate controlling current in a channel between a first output node and a second tail node;
a third load between the first supply and the first output node, the third load having a third resistor in parallel with a channel of a third load transistor;
a fourth differential transistor having a gate that receives the second inter-stage node, the gate controlling current in a channel between a second output node and the second tail node; and
a fourth load between the first supply and the second output node, the fourth load having a fourth resistor in parallel with a channel of a fourth load transistor;
wherein the second stage further comprises:
a first shunt resistor coupled between the first inter-stage node and the first output node;
a second shunt resistor coupled between the second inter-stage node and the second output node,
whereby the second stage is a shunt-shunt-feedback stage and whereby the first, second, third, and fourth loads each have a resistor and a transistor in parallel.

2. The wideband amplifier of claim 1 further comprising:
a first tail transistor that conducts current from the first tail node to a second supply;
a second tail transistor that conducts current from the second tail node to the second supply.

3. The wideband amplifier of claim 2 wherein the first, second, third, and fourth differential transistors are n-channel transistors;
wherein the first, second, third, and fourth load transistors are p-channel transistors.

4. The wideband amplifier of claim 3 wherein the first supply is a power supply and the second supply is a ground.

5. The wideband amplifier of claim 4 wherein the first and second tail transistors are n-channel transistors.

6. The wideband amplifier of claim 5 wherein gates of the first, second, third, and fourth load transistors are driven by a first bias voltage.

7. The wideband amplifier of claim 6 wherein the first bias voltage is a voltage between the first supply and the second supply.

8. The wideband amplifier of claim 7 further comprising:
a bias generator, coupled between the first supply and the second supply, the bias generator generating the first bias voltage.

9. The wideband amplifier of claim 8 wherein gates of the first and second tail transistors are driven by a second bias voltage.

10. The wideband amplifier of claim 9 wherein the bias generator also generates the second bias voltage.

11. The wideband amplifier of claim 10 wherein a size of the first load transistor is less than half of a size of the first tail transistor;
wherein a size of the third load transistor is less than half of a size of the second tail transistor;
wherein a size of the second load transistor is a same size as the size of the first load transistor;
wherein a size of the fourth load transistor is a same size as the size of the third load transistor.

12. The wideband amplifier of claim 2 wherein the first supply is a ground and the second supply is a power supply;
wherein the first, second, third, and fourth differential transistors are p-channel transistors;
wherein the first, second, third, and fourth load transistors are n-channel transistors.

13. A multi-stage amplifier comprising:
a transconductance stage receiving a first differential input and a second differential input and driving a first differential intermediate node and a second differential intermediate node;
a shunt-shunt-feedback stage receiving the first differential intermediate node and the second differential intermediate node as inputs and driving a first differential output and a second differential output;
wherein the transconductance stage comprises:
a first differential transistor having a gate receiving the first differential input, a source connected to a first tail node, and a drain driving the first differential intermediate node;
a first load resistor connected between the first differential intermediate node and a first supply;
a first load transistor connected between the first differential intermediate node and the first supply and having a gate driven by a first bias voltage;
wherein the first load resistor and the first load transistor are connected in parallel;
a first tail transistor having a gate driven by a second bias voltage and a source connected to a second supply and a drain connected to the first tail node;

a second differential transistor having a gate receiving the second differential input, a source connected to the first tail node, and a drain driving the second differential intermediate node;

a second load resistor connected between the second differential intermediate node and the first supply;

a second load transistor connected between the second differential intermediate node and the first supply and having a gate driven by the first bias voltage;

wherein the second load resistor and the second load transistor are connected in parallel;

wherein the shunt-shunt-feedback stage comprises:

a third differential transistor having a gate receiving the first differential intermediate node, a source connected to a second tail node, and a drain driving the first differential output;

a third load resistor connected between the first differential output and the first supply;

a third load transistor connected between the first differential output and the first supply and having a gate driven by the first bias voltage;

wherein the third load resistor and the third load transistor are connected in parallel;

a fourth differential transistor having a gate receiving the second differential intermediate node, a source connected to the second tail node, and a drain driving the second differential output;

a fourth load resistor connected between the second differential output and the first supply;

a fourth load transistor connected between the second differential output and the first supply and having a gate driven by the first bias voltage;

wherein the fourth load resistor and the fourth load transistor are connected in parallel;

a second tail transistor having a gate driven by the second bias voltage and a source connected to the second supply and a drain connected to the second tail node;

a first feedback resistor connected between the first differential intermediate node and the first differential output; and a second feedback resistor connected between the second differential intermediate node and the second differential output.

14. The multi-stage amplifier of claim 13 wherein the multi-stage amplifier comprises a plurality of stages in a cascade, each stage comprising the transconductance stage and the shunt-shunt-feedback stage;

whereby the multi-stage amplifier is cascaded.

15. The multi-stage amplifier of claim 14 further comprising:

an offset cancellation, having the first and second differential outputs of a last stage in the cascade as inputs, and driving a bias onto a first differential input and a second differential input to a first stage in the cascade.

16. The multi-stage amplifier of claim 13 wherein the first supply is a power supply and the second supply is a ground;

wherein the first, second, third, and fourth load transistors are p-channel transistors;

wherein the first, second, third, and fourth differential transistors are n-channel transistors.

17. An amplifier comprising:

a first differential input and a second differential input;

first differential transistor means for controlling a first current between a first intermediate node and a first tail node in response to the first differential input;

first resistor load means for supplying a current to the first intermediate node from a first supply in response to a voltage difference between the first supply and the first intermediate node;

first transistor load means for controlling a first load current between the first supply and the first intermediate node in response to a first bias voltage;

second differential transistor means for controlling a second current between a second intermediate node and the first tail node in response to the second differential input;

second resistor load means for supplying a current to the second intermediate node from the first supply in response to a voltage difference between the first supply and the second intermediate node;

second transistor load means for controlling a second load current between the first supply and the second intermediate node in response to the first bias voltage;

third differential transistor means for controlling a third current between a first differential output and a second tail node in response to the first intermediate node;

third resistor load means for supplying a current to the first differential output from the first supply in response to a voltage difference between the first supply and the first differential output;

third transistor load means for controlling a third load current between the first supply and the first differential output in response to the first bias voltage;

fourth differential transistor means for controlling a fourth current between a second differential output and the second tail node in response to the second intermediate node;

fourth resistor load means for supplying a current to the second differential output from the first supply in response to a voltage difference between the first supply and the second differential output;

fourth transistor load means for controlling a fourth load current between the first supply and the second differential output in response to the first bias voltage;

first feedback means for shunting current between the first differential output and the first intermediate node in response to a voltage difference between the first differential output and the first intermediate node; and second feedback means for shunting current between the second differential output and the second intermediate node in response to a voltage difference between the second differential output and the second intermediate node.

18. The amplifier of claim 17 further comprising:

first current sink means for sinking a first sink current between the first tail node and a second supply; and second current sink means for sinking a second sink current between the second tail node and a second supply.

19. The amplifier of claim 17 wherein a gain of the amplifier is at least 40 decibels when a frequency of the first and second differential inputs is one Gigahertz.

* * * * *